(12) United States Patent
Matus et al.

(10) Patent No.: US 10,634,736 B2
(45) Date of Patent: Apr. 28, 2020

(54) MAGNETORESISTIVE SENSORS AND SWITCHES FROM PRE-BUNDLED NANOWIRES

(71) Applicant: Littelfuse, Inc., Chicago, IL (US)

(72) Inventors: Yuriy B. Matus, Pleasanton, CA (US); Martin G. Pineda, Fremont, CA (US)

(73) Assignee: Littelfuse, Inc., Chicago, IL (US)

(*) Notice: Subject to any disclaimer, the term of this patent is extended or adjusted under 35 U.S.C. 154(b) by 213 days.

(21) Appl. No.: 16/006,083

(22) Filed: Jun. 12, 2018

(65) Prior Publication Data

US 2018/0356471 A1 Dec. 13, 2018

Related U.S. Application Data

(60) Provisional application No. 62/518,290, filed on Jun. 12, 2017.

(51) Int. Cl.
| | |
|---|---|
| *H01L 43/12* | (2006.01) |
| *G01R 33/00* | (2006.01) |
| *G01R 33/09* | (2006.01) |
| *C09D 7/40* | (2018.01) |
| *C09D 5/24* | (2006.01) |
| *C09D 11/00* | (2014.01) |

(52) U.S. Cl.
CPC ........... *G01R 33/0052* (2013.01); *C09D 5/24* (2013.01); *C09D 7/70* (2018.01); *C09D 11/00* (2013.01); *G01R 33/093* (2013.01); *H01L 43/12* (2013.01)

(58) Field of Classification Search
CPC .................... G01R 33/0052; G01R 33/093
See application file for complete search history.

(56) References Cited

U.S. PATENT DOCUMENTS

| | | | | |
|---|---|---|---|---|
| 4,284,612 | A * | 8/1981 | Horne, Jr. | ............... C01B 32/97 423/345 |
| 5,388,328 | A * | 2/1995 | Yokono | ............... H01L 21/4857 174/267 |
| 6,383,432 | B1 * | 5/2002 | Nakajima | ............... D01D 5/08 264/210.7 |
| 7,857,959 | B2 * | 12/2010 | Fourkas | ............... B82Y 25/00 205/118 |
| 9,272,913 | B2 * | 3/2016 | Garnier | ............... C01B 32/956 |
| 9,803,296 | B2 * | 10/2017 | Garnier | ............... C04B 35/565 |
| 10,435,820 | B2 * | 10/2019 | Garnier | ............... D01F 8/00 |
| 2016/0265143 | A1 * | 9/2016 | Garnier | ............. C04B 35/62277 |
| 2018/0051396 | A1 * | 2/2018 | Garnier | ............... C08K 7/04 |

OTHER PUBLICATIONS

Zhang, Z., Ying, J., & Dresselhaus, M. (1998). Bismuth quantum-wire arrays fabricated by a vacuum melting and pressure injection process. Journal of Materials Research, 13(7), 1745-1748. doi:10.1557/JMR.1998.0243 (Year: 1998).*

* cited by examiner

*Primary Examiner* — Alesa Allgood

(57) ABSTRACT

A method for forming a magnetoresistive sensor. The method may include dissolving a substrate, the substrate comprising plated nanowires, wherein a dissolved substrate is formed. The method may further include forming an intermediate mixture from the dissolved substrate, and forming pre-bundled nanowires from the intermediate mixture.

13 Claims, 2 Drawing Sheets

MAGNETORESISTIVE SENSORS AND SWITCHES FROM PRE-BUNDLED NANOWIRES

RELATED APPLICATIONS

This application claims priority to U.S. Provisional Patent Application No. 62/518,290, entitled "Magnetoresistive Sensors and Switches from Prebundled Nanowires," filed Jun. 12, 2017, and incorporated by reference herein in its entirety.

FIELD OF THE DISCLOSURE

Embodiments of the present disclosure relate generally to the field magnetoresistance sensors, and more particularly to giant magnetoresistance ("GMR") nanowires.

BACKGROUND OF THE DISCLOSURE

Magnetoresistance is a material property in which its electrical resistance changes when a magnetic field is applied. Giant magnetoresistance ("GMR") is a type of magnetoresistance in which multilayers may alternate between ferromagnetic and non-magnetic layers. Sensors or switches including GMR nanowires are typically formed by substrate embedded or discrete dispersed nanowires. However, devices utilizing substrate embedded nanowires suffer from the disadvantage of not producing enough surface area. The cost per device is thereby increased when several devices are needed for a single AC circuit.

Devices using discrete dispersed nanowires improve upon substrate embedded nanowires by dissolving the substrates and spreading the discrete nanowires over a flat surface of the spread substrate. This result may be accomplished using a scalable process, e.g., screen printing or spraying. However, discrete nanowires may be difficult to disperse into a solution in a repeatable manner to obtain consistent wire-to-wire contact.

It is with respect to these and other considerations that the present improvements may be useful.

SUMMARY

In one embodiment, a method for forming a magnetoresistive sensor is provided. The method may include dissolving a substrate, the substrate comprising plated nanowires, wherein a dissolved substrate is formed. The method may further include forming an intermediate mixture from the dissolved substrate, and forming pre-bundled nanowires from the intermediate mixture.

In another embodiment, a method for forming a magnetoresistive sensor including pre-bundled GMR nanowires is disclosed. The method may include grinding a plurality of nanowires with a substrate to form a ground mixture, including primary nanowires. The method may further include embedding the primary nanowires in a dielectric mixture to form an embedded mixture. The method may also include adding polymer solids to the embedded mixture to form a composite mixture, and extruding the composite mixture. The method may additionally include forming pre-bundled nanowires from the composite mixture, wherein the pre-bundled nanowires comprises secondary particles, wherein the primary nanowires are disposed within the secondary particles.

In an additional embodiment, a magnetoresistive sensor is provided. The magneto resistive sensor may include a substrate, and a plurality of pre-bundled nanowires, disposed on the substrate.

BRIEF DESCRIPTION OF FIGURES

The accompanying drawings illustrate exemplary approaches of the disclosure, including the practical application of the principles thereof, as follows.

Figure 1:
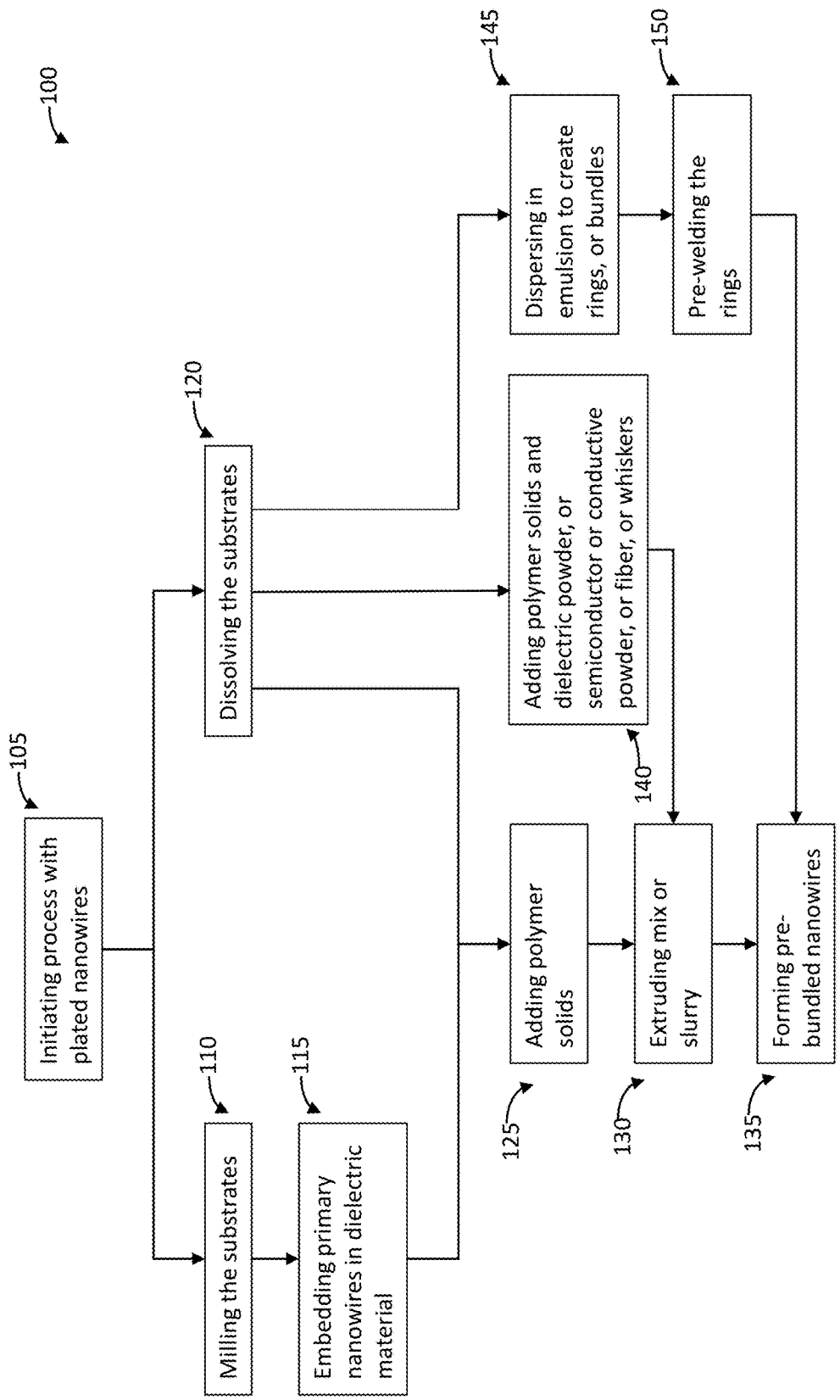
FIG. 1, shows an exemplary process flow, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

Magnetoresistive sensors and switches in accordance with the present disclosure will now be described more fully hereinafter with reference to the accompanying drawings, in which certain exemplary embodiments of the magnetoresistive sensors and switches are presented. The magnetoresistive sensors and switches may be embodied in many different forms and are not to be construed as being limited to the embodiments set forth herein. These embodiments are provided so that this disclosure will be thorough and complete, and will convey certain exemplary aspects of the magnetoresistive sensors and switches to those skilled in the art. In the drawings, like numbers refer to like elements throughout unless otherwise noted.

In accordance with an exemplary embodiment of the present disclosure, GMR nanowires may be pre-bundled or pre-assembled, and pre-welded or pre-intertwined into any of clusters, braids, or rings around a dielectric material, for inclusion in a magnetoresistive sensor. In some embodiments, the dielectric material may not be included. Nanowires that are pre-bundled may improve dispersement in the GMR device, thereby forming better contacts. In some embodiments, GMR devices may be a supplement to or a replacement of Reed switches. Although nanowires are described, it is understood that fibers, whiskers, and/or particles may be used to describe the pre-bundled nanowires, and that the methods described are also suitable for microwires. Pre-bundling nanowires may provide a more repeatable dispersion than individual, or discrete, nanowires to better control GMR device loadings. In this manner, pre-bundling may form secondary particles, or fibers (including microfibers, or bundled nanofibers), where primary nanoparticles or wires are disposed inside of the secondary particles or fibers. The secondary particles, or fibers, may be deposited by a spray or screen printing process, and in some embodiments, the particles or fibers may be deposited with a liquid, e.g., that does not require ultrasonication, or by electrostatic spray without any liquid. In other embodiments, the particles, or fibers, may be 3D-printed using a secondary fiber as a feeder.

The nanowire bundles, or clusters, may be formed via emulsion, for example, a Pickering emulsion, where the emulsion is stabilized by the nanowires. In some embodiments, bundles may be premixed with a dielectric power and binder. Other embodiments may involve, instead of dissolving a matrix where the nanowire is deposited, pre-grinding so that the wires are embedded in secondary particles. In other embodiments, two polymers may be melted and mixed with nanoparticles. Each polymer may be separately dissolvable, so that one solvent cannot dissolve both polymers. One polymer may therefore be dissolved by a solvent, resulting in the remaining polymer including the pre-bundled nanowires.

Figures 1A, 2:
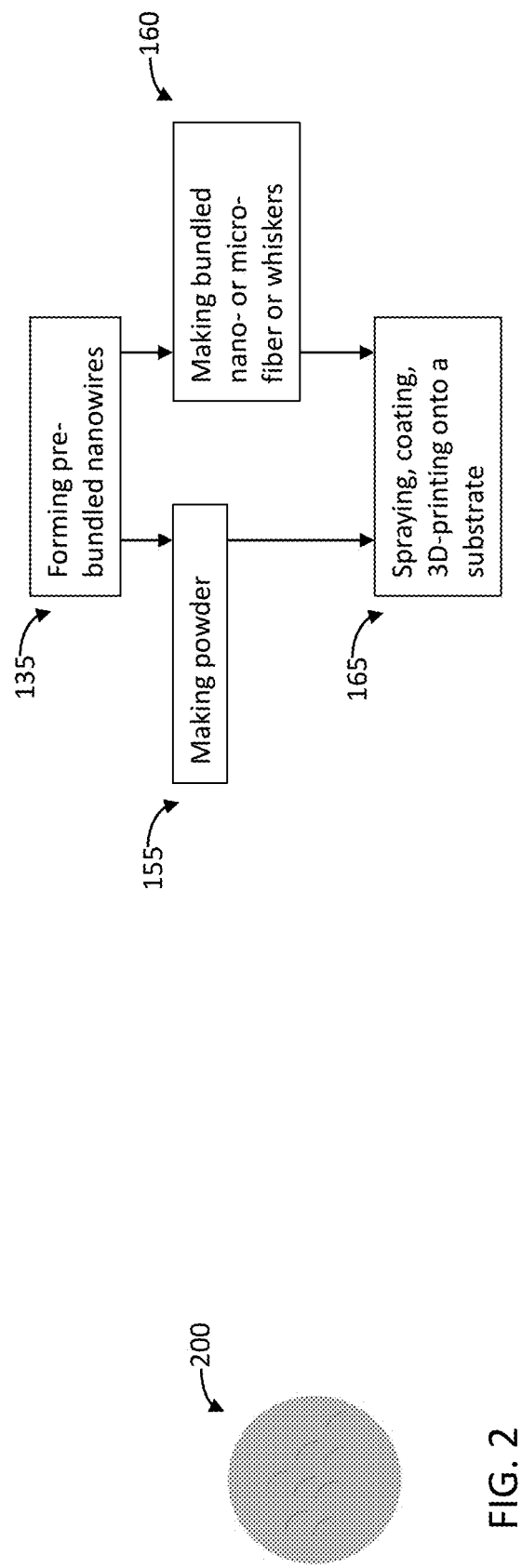
FIG. 1A shows a further process flow according to additional embodiments of the disclosure.
FIG. 2 shows an exemplary nanowire structure at an intermediate stage of processing according to various embodiments of the disclosure.

Referring now to FIG. 1, a flowchart 100 illustrating an exemplary embodiment for forming pre-bundled nanoparticles is shown. At step 105, the process begins with plated nanowires 200, as shown in FIG. 2. The process may continue by either milling the nanowires with a substrate at step 110, or dissolving the substrates at step 120. For example, the substrate may be anodized alumina created filter, with pipe-like nanopores across the substrate, filled with metal nanowires. When the substrate-with-nanowires is are milled at step 110, primary nanowires may then be embedded in dielectric material at 115, and polymer solids may be added at step 125.

Said differently, when a substrate formed from dielectric is milled part of substrate remains in milled form with nanowires embedded in the dielectric of the substrate.

In some embodiments, the polymer solids may be polymer pellets. In contrast, when the substrates are dissolved at 120 to form a dissolved substrate, polymer solids and dielectric powder are subsequently added at step 140 to form an intermediate mixture. In some embodiments, an intermediate mixture may be formed by adding a semiconductor, a conductive powder, a fiber(s), or a set of whiskers. As in step 125, the polymer solids added in step 140 may be polymer pellets, and the dielectric powder may be silicon dioxide ($SiO_2$), aluminum oxide, and the like.

As an alternative, dielectric powder may be substituted or augmented by semiconducting particles/media, for example, silicon or ZnO, but not limited by or carefully put conductive particles or fibers, for example, carbon black or other.

In another embodiment in accordance with the present disclosure, when the substrates are dissolved at 120, the dissolved substrates may be dispersed in an emulsion dispersion process, thereby forming rings, or bundles at step 145. The rings are then pre-welded at step 150, for forming into pre-bundled nanowires at step 135. As an example, ultrathin nanowires, may be mixed in an emulsion, such as a Pickering emulsion, to form coils. Pre-welding rings may be made by various energy schemes, including but not limited to thermal, UV, microwave, ultrasonic, and the like.

After the polymer solids are added at step 125, or the polymer solids and the dielectric powder are added at step 140, the nanowires, polymer solids, and dielectric powder form a slurry, or mix for extruding at step 130. For example, a Brabender device may be utilized for forming the pre-bundled nanowires at step 135.

As shown in FIG. 1A, once the pre-bundled nanowires are formed at step 135, they may be included in making a powder at step 155, or making bundled nanowires at step 160, depending on the selected application process of 165. In some embodiments, particle size may range up to 50 microns in size, while the size of bundled nanowires ranges up to 5 microns in size. The embodiments are not limited in this context. As described above, pre-bundled nanowires may be applied to a given substrate in any of several methods, including but not limited to spraying, screen printing, coating, and 3D-printing. In this way, instead of individual nanowires being applied to a substrate as in previously known devices, pre-bundling the nanowires prior to applying to a substrate provides for better wire-to-wire contact.

What is claimed is:

1. A method for forming a magnetoresistive sensor, comprising: dissolving a substrate, the substrate comprising plated nanowires, wherein a dissolved substrate is formed; forming an intermediate mixture from the dissolved substrate; and forming pre-bundled nanowires from the intermediate mixture; wherein the pre-bundled nanowires comprise a plurality of secondary particles, wherein primary nanowires are disposed within the secondary particles; wherein the primary nanowires comprise giant magnetoresistance (GMR) nanowires.

2. The method of claim 1, further comprising:
   forming a powder from the pre-bundled nanowires; and
   applying the powder to a substrate by spraying, coating, screen printing, or 3D printing the powder.

3. The method of claim 1, further comprising:
   forming bundled nanofibers, microfibers, or whiskers from the pre-bundled nanowires; and
   applying the bundled nanofibers, microfibers, or whiskers to a substrate by spraying, coating screen printing, or 3D printing the powder.

4. The method of claim 1, wherein the forming the intermediate mixture comprises adding polymer solids to the dissolved substrate.

5. The method of claim 4, wherein the intermediate mixture comprises a slurry or a mix, wherein the forming the intermediate mixture further comprises extruding the intermediate mixture.

6. The method of claim 4, wherein the forming the intermediate mixture further comprises adding at least one of: a dielectric powder, a semiconductor, a conductive powder, a fiber, and a set of whiskers.

7. The method of claim 6, wherein the intermediate mixture comprises a slurry or a mix, wherein the forming the intermediate mixture further comprises extruding the intermediate mixture.

8. The method of claim 1, further comprising dispersing the dissolved substrate in an emulsion, wherein a set of rings or a set of bundles is created.

9. The method of claim 8, further comprising pre-welding the set of rings before the forming the pre-bundled nanowires.

10. The method of claim 9, wherein the pre-welding comprises thermal processing, ultraviolet processing, microwave processing, or ultrasonic processing.

11. A method for forming a magnetoresistive sensor including pre-bundled GMR nanowires, comprising: grinding a plurality of nanowires with a substrate to form a ground mixture, including primary nanowires; embedding the primary nanowires in a dielectric mixture to form an embedded mixture; adding polymer solids to the embedded mixture to form a composite mixture; extruding the composite mixture; and forming pre-bundled nanowires from the composite mixture, wherein the pre-bundled nanowires comprises secondary particles, wherein the primary nanowires are disposed within the secondary particles; wherein the primary nanowires comprise giant magnetoresistance (GMR) nanowires.

12. The method of claim 11, further comprising:
   forming a powder from the pre-bundled nanowires; and
   applying the powder to a given substrate by spraying, coating screen printing, or 3D printing the powder.

13. The method of claim 11, further comprising:
forming bundled nanofibers, microfibers, or whiskers from the pre-bundled nanowires; and
applying the bundled nanofibers, microfibers, or whiskers to a given substrate by spraying, coating screen printing, or 3D printing the powder.

* * * * *